United States Patent
Lee et al.

(10) Patent No.: US 7,800,524 B2
(45) Date of Patent: Sep. 21, 2010

(54) SIGMA-DELTA MODULATOR ARCHITECTURE CAPABLE OF AUTOMATICALLY IMPROVING DYNAMIC RANGE METHOD FOR THE SAME

(75) Inventors: Shuenn-Yuh Lee, Minxiong Shiang (TW); Rong-Guey Chang, Minsyong Township, Chiayi County (TW); Chih-Yuan Chen, Kaohsiung (TW); Jia-Hua Hong, Keelung (TW)

(73) Assignee: National Chung Cheng University, Chia-Yi (TW)

( * ) Notice: Subject to any disclaimer, the term of this patent is extended or adjusted under 35 U.S.C. 154(b) by 31 days.

(21) Appl. No.: 12/431,241

(22) Filed: Apr. 28, 2009

(65) Prior Publication Data
US 2010/0164769 A1 Jul. 1, 2010

(30) Foreign Application Priority Data
Dec. 30, 2008 (TW) .............................. 97151307 A

(51) Int. Cl.
H03M 3/00 (2006.01)
(52) U.S. Cl. ........................................ 341/143; 455/75
(58) Field of Classification Search ................ 341/143; 375/349, 298, 344; 455/75, 77, 84, 283, 455/296; 381/107
See application file for complete search history.

(56) References Cited

U.S. PATENT DOCUMENTS
7,580,684 B2* 8/2009 Cyr et al. ...................... 455/75

* cited by examiner

Primary Examiner—Joseph Lauture
(74) Attorney, Agent, or Firm—Ming Chow; Sinorica, LLC

(57) ABSTRACT

The present invention discloses a sigma-delta modulator architecture capable of automatically improving dynamic range and a method for the same. Based on the concept that different dynamic ranges of a sigma-delta modulator can be obtained via adjusting the signal power gain thereof, the present invention provides a novel algorithm to implement an automation program. The present invention finds out several sets of dynamic-range curves to improve the overall dynamic range. Via a high-level sigma-delta modulator architecture, the present invention can calculate the required feedforward coefficients. Further, the present invention install in the sigma-delta modulator architecture with four additional components, including a peak detection unit, a comparator unit, a digital coefficient control unit and a switch unit, to dynamically detect the output of the sigma-delta modulator and dynamically modify the feedforward coefficient of the sigma-delta modulator. Thus is extended the dynamic range of the sigma-delta modulator.

14 Claims, 7 Drawing Sheets

SIGMA-DELTA MODULATOR ARCHITECTURE CAPABLE OF AUTOMATICALLY IMPROVING DYNAMIC RANGE METHOD FOR THE SAME

BACKGROUND OF THE INVENTION

1. Field of the Invention

The present invention relates to a sigma-delta modulator architecture and a method for realizing the architecture, particularly to a sigma-delta modulator architecture capable of automatically improving dynamic range and a method for the same.

2. Description of the Related Art

Recently, the sigma-delta modulator (SDM) has been extensively used in audio systems, including common MP3 devices and top-class audio systems. How a product is designed to satisfy the requirements of low cost and high efficiency has become an important issue in the electronic industry. So far, all the existing technologies for improving the SDM dynamic range focus on designing a new quantizer, which requires the variation of the original architecture and additional hardware. Thus, a lot of time and capital is spent on finding an adequate specification.

To solve the abovementioned problems, the present invention proposes a SDM architecture capable of automatically improving dynamic range and a method for the same, which are realized via varying the feedforward coefficients of the original architecture. The present invention uses an algorithm to vary the SDM signal power gain and uses a program to automatically work out several sets of feedforward coefficients. Furthermore, the present invention installs additional hardwares—a peak detector, a comparator, a digital controller and switches into the SDM architecture, whereby the present invention can dynamically detect the output of each stage of SDM and modify the feedforward coefficient and thus improve the SDM dynamic range.

SUMMARY OF THE INVENTION

The primary objective of the present invention is to provide a sigma-delta modulator architecture capable of automatically improving dynamic range and a method for the same, wherein an algorithm is used to calculate the feedforward coefficients required by a sigma-delta modulator, and wherein peak detectors, comparators, a digital coefficient controller and switches are used to automatically modify the dynamic range of the sigma-delta modulator.

The present invention proposes a sigma-delta modulator architecture capable of automatically improving dynamic range, which comprises a sigma-delta modulation unit, a dynamic-range-search algorithm unit, a peak detection unit, a comparator unit, a digital coefficient control unit and a switch unit. The sigma-delta modulation unit performs the conversion of digital signals and analog signals with an oversampling and a noise-shaping technique. The dynamic-range-search algorithm unit searches for several sets of dynamic-range curves and improves the overall dynamic range according to the variation of the signal power gain of the sigma-delta modulation unit. Then, the dynamic-range-search algorithm unit works out the feedforward coefficients required by the sigma-delta modulation unit via a high-level sigma-delta modulation architecture unit. The peak detection unit dynamically monitors the output of each stage of the sigma-delta modulation unit. The comparator unit dynamically compares the lowest threshold voltage defined by the divergent output voltage. The digital coefficient control unit receives the outputs of the comparator unit to dynamically switch the feedforward coefficients. The switch unit switches among several sets of the feedforward coefficients for modulation and dynamically provides different dynamic ranges for the sigma-delta modulation unit.

The dynamic-range-search algorithm unit searches for zero points of a signal transfer function, varies the zero points to obtain different signal power gains, collects the zero points meeting requirements, and applies the zero points meeting requirements to the feedforward coefficients obtained in the architecture. The dynamic-range-search algorithm does not change pole points of the signal transfer function but only varies the zero points of the signal transfer function; in other words, the denominator of the signal transfer function is unchanged. Such a modification does not affect the design of the original architecture or the stability of the system. Therefore, the present invention can promote the performance of the system without changing the architecture of the sigma-delta modulation unit. The peak detection unit and the comparator unit detect the outputs of the first stage integrator and the last stage integrator during the operation of the system. If the peak detection unit and the comparator unit detect that the output is lower than a threshold value or has been divergent, the comparator unit triggers the digital coefficient control unit, and the digital coefficient control unit triggers the switch unit to replace an original feedforward coefficient with a new feedforward coefficient. Thus, the feedforward coefficient is changed automatically, and the dynamic range is extended.

Below, the embodiments are described in detail in cooperation with the attached drawings to make easily understood the objectives, technical contents, characteristics and accomplishments of the present invention.

DETAILED DESCRIPTION OF THE INVENTION

The present invention pertains to a sigma-delta modulator (SDM) architecture capable of automatically improving dynamic range and a method for the same, which use an algorithm to search for several dynamic-range curves and obtain the required feedforward coefficients, and which additionally adopt new hardware to automatically modify the SDM dynamic range.

Figure 1:
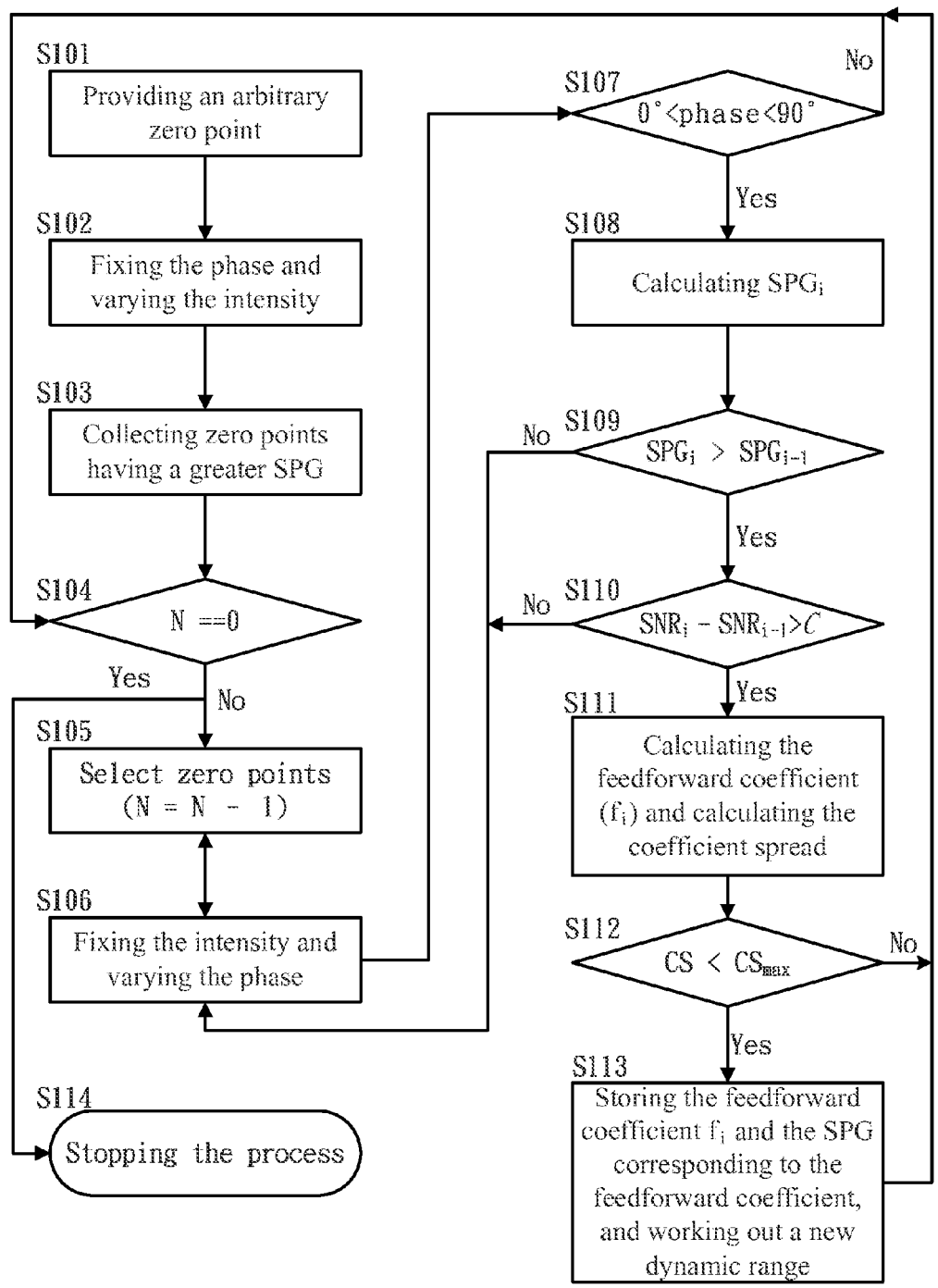
FIG. 1 is a flowchart of the process of a dynamic-range-search algorithm according to one embodiment of the present invention.

The SDM architecture capable of automatically improving dynamic range of the present invention comprises a sigma-delta modulation unit, a dynamic-range-search algorithm unit, a peak detection unit, a comparator unit, a digital coefficient control unit and a switch unit. The sigma-delta modulation unit performs the conversion of digital signals and analog signals with an oversampling and a noise-shaping technique. The dynamic-range-search algorithm unit searches for several sets of dynamic-range curves and improves the dynamic range according to the variation of the signal power gain of the sigma-delta modulation unit. Then, the dynamic-range-search algorithm unit works out the feedforward coefficients required by the sigma-delta modulation unit via a high-level sigma-delta modulation architecture unit. Refer to FIG. 1 for a flowchart of the process of the algorithm used by the dynamic-range-search algorithm unit according to the present invention. The process includes 14 steps: Step S101: starting the process and the system automatically providing an arbitrary zero point; Step S102: fixing the phase and varying the intensity; Step S103: collecting zero points; Step S104: determining whether there is still a zero point; Step S105: choosing a zero point; Step S106: fixing the intensity and varying the phase; Step S107: determining whether the phase exceeds the rational range; Step S108: calculating $SPG_i$ (Signal Power Gain); Step S109: determining whether the latter $SPG_i$ is higher than the former $SPG_{i-1}$; Step S510: determining whether the difference of the latter $SNR_i$ (Signal-to-Noise Ratio) and the former $SNR_{i-1}$ is greater than the required value; Step S111: calculating the feedforward coefficient ($f_i$) and calculating the coefficient spread (CS); Step S112: determining whether CS exceeds the limit of the system $CS_{max}$; Step S113: storing the feedforward coefficient $f_i$ and the SPG corresponding to the feedforward coefficient, and working out a new dynamic range; and Step S114: stopping the process.

Steps S101, S102 and S103 are the initialization steps of the system. Step S101 provides an arbitrary zero point. Step S102 performs the first stage of screening via fixing the phase and varying the intensity. Step S103 collects the zero points having an identical phase and different Intensities and having higher SPGs and provides the collected zero points for the succeeding steps.

Step S104 determines whether there is a zero point remaining. If there is none zero point remaining, the process jumps to Step114, and the process stops. If there is a zero point remaining, the process proceeds to Step S105, and Step S105 selects one zero point from the zero points collected in Step S103 and incrementally reducing the count of the collected zero points.

Step S106 fixes the intensity and varies the phase. Step S107 determines whether the phase is in the rational range. If the phase is not in the rational range, the process jumps to Step S104. If the phase is in the rational range, the process proceeds to Step S108, and Step S108 works out the intensity of the SPG corresponding to the zero point.

Step S109 examines whether the intensity of the SPG corresponding to the zero point is higher than that of the former SPG If the current SPG is not higher than the former SPG, the process proceeds to Step S106 and continues to vary the phase (increase or decrease the value of the phase). If the current SPG is higher than the former SPG, the process proceeds to Step S110, and Step S110 calculates the current signal-to-noise ratio $SNR_i$ corresponding to the current $SPG_i$, and compares the current signal-to-noise ratio $SNR_i$ with the former signal-to-noise ratio $SNR_{i-1}$ corresponding to the former $SPG_{i-1}$. If the current signal-to-noise ratio $SNR_i$ is higher than the former signal-to-noise ratio $SNR_{i-1}$ by a value C the user sets, the process proceeds to Step S11. If the current signal-to-noise ratio $SNR_i$ is not higher than the former signal-to-noise ratio $SNR_{i-1}$ by the value C, the process returns to Step S106.

In Step S110, each two dynamic-range curves are separated by C dB. In other words, the value C, which is set by the user, determines the number of the dynamic-range curves found out by the system.

Step S111 works out the feedforward coefficients of the architecture and the coefficient spread CS of all feedforward coefficients. Step S112 examines whether the coefficient spread CS is smaller than the CS maximum value $CS_{max}$ set by the user. If the coefficient spread CS is smaller than the CS maximum value $CS_{max}$, the process proceeds to Step S113. If the coefficient spread CS is greater than the CS maximum value $CS_{max}$, the process returns to Step S104. The user determines the CS maximum value $CS_{max}$ according to the capability of the hardware.

Step S113 stores the feedforward coefficients and the current signal noise ratio $SNR_i$, which meet the abovementioned conditions, and works out a new dynamic-range curve. Then, the process returns to Step S104 and continues to search for another new dynamic-range curve.

Figure 2:
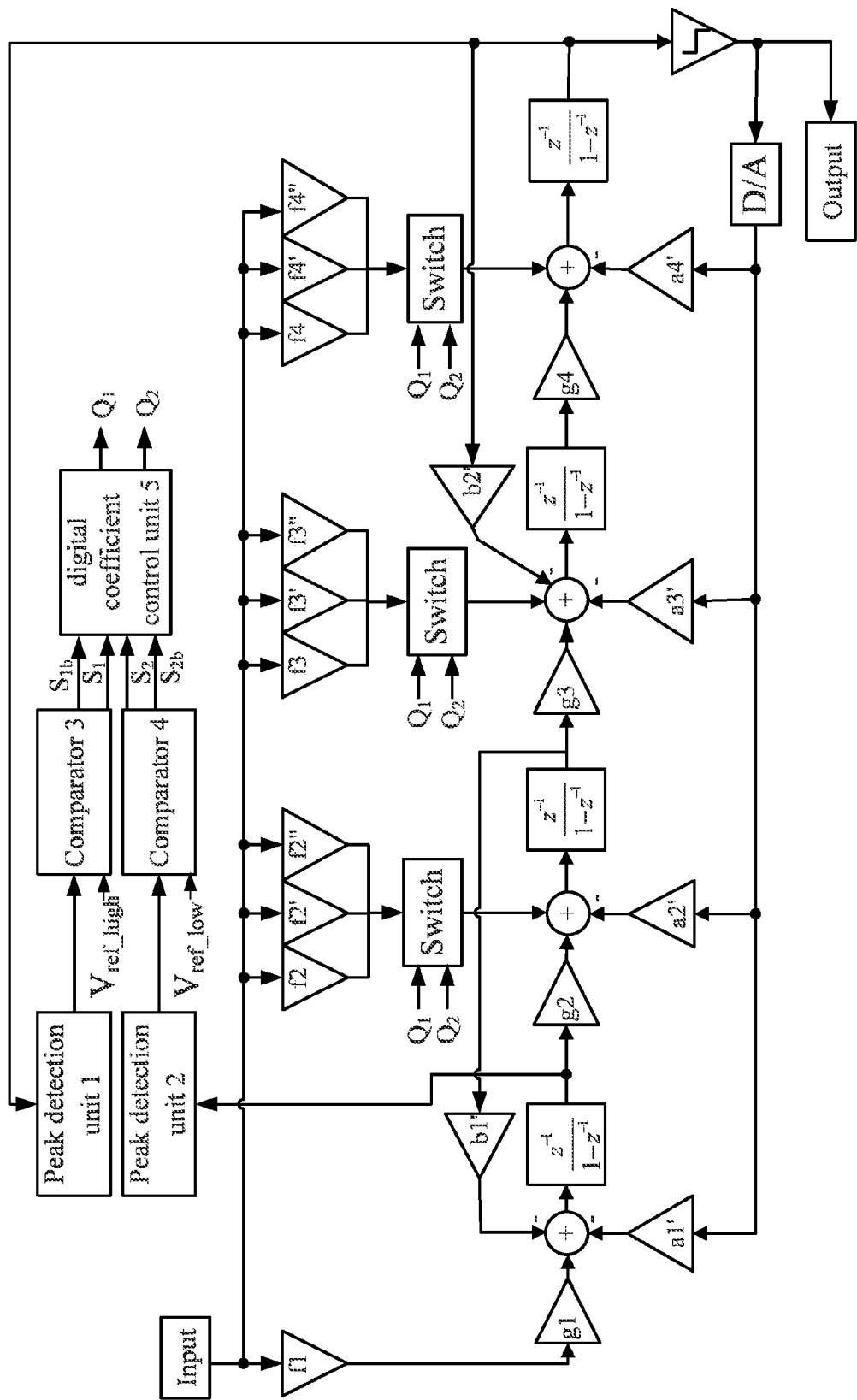
FIG. 2 is diagram schematically showing an architecture for automatically adjusting feedforward coefficients to extend the dynamic range according to one embodiment of the present invention.
Figure 3:
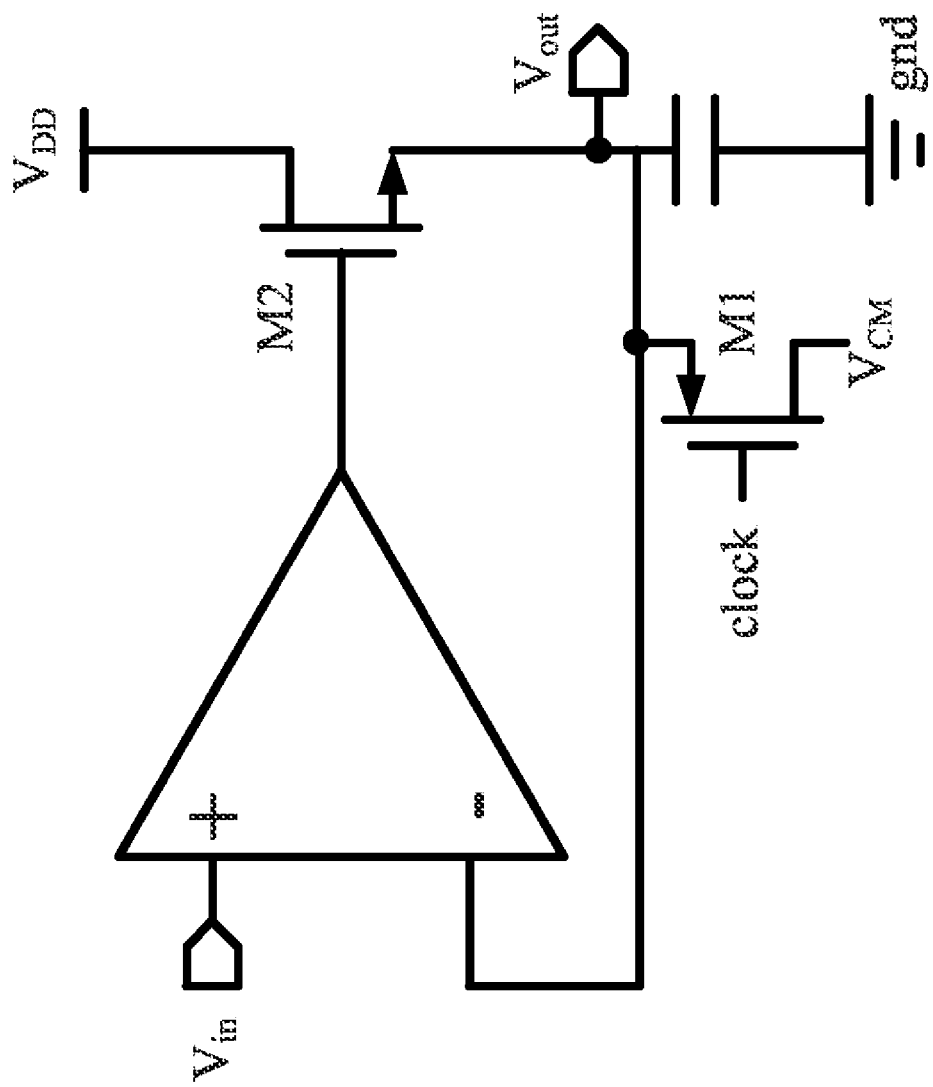
FIG. 3 is diagram schematically showing the circuit of a peak detection unit according to one embodiment of the present invention.
Figure 4:
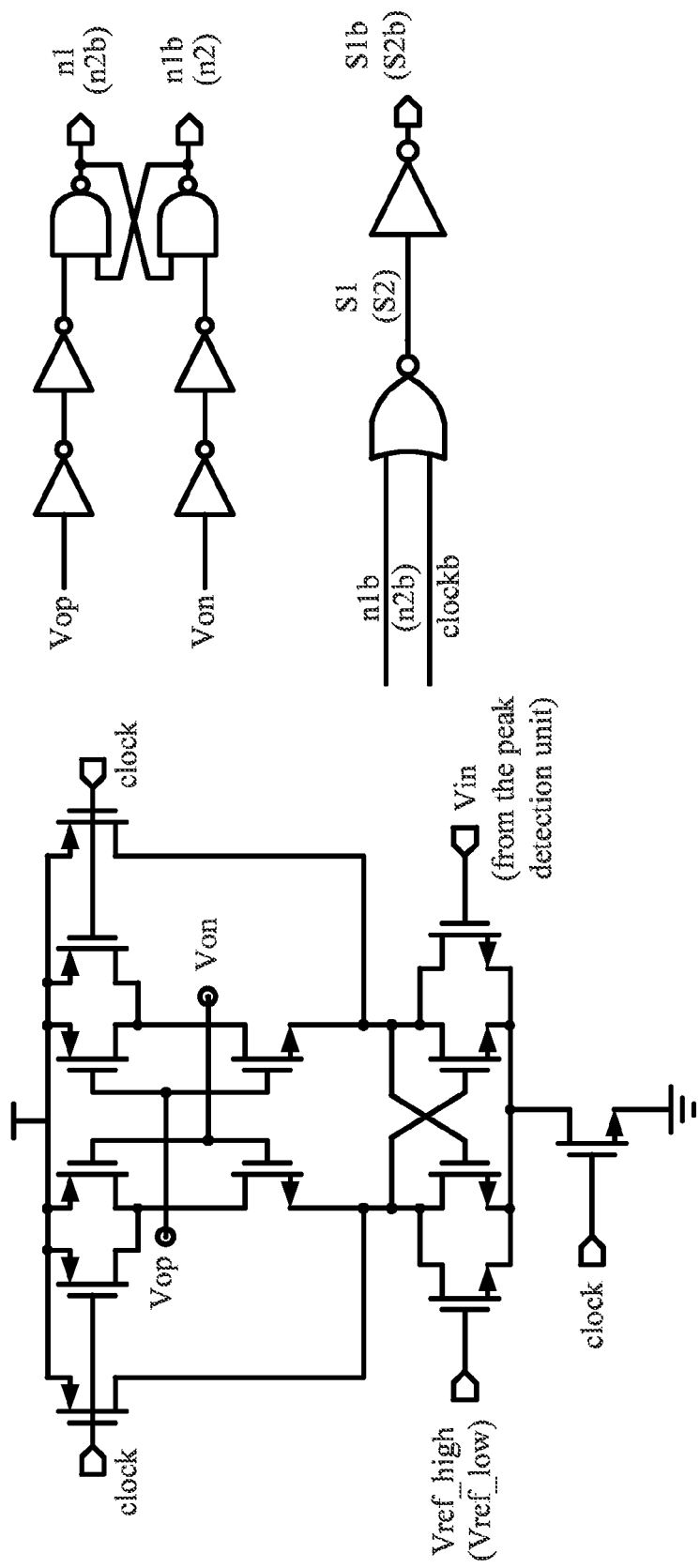
FIG. 4 is a diagram schematically showing the circuit of a comparator according to one embodiment of the present invention.
Figure 5:
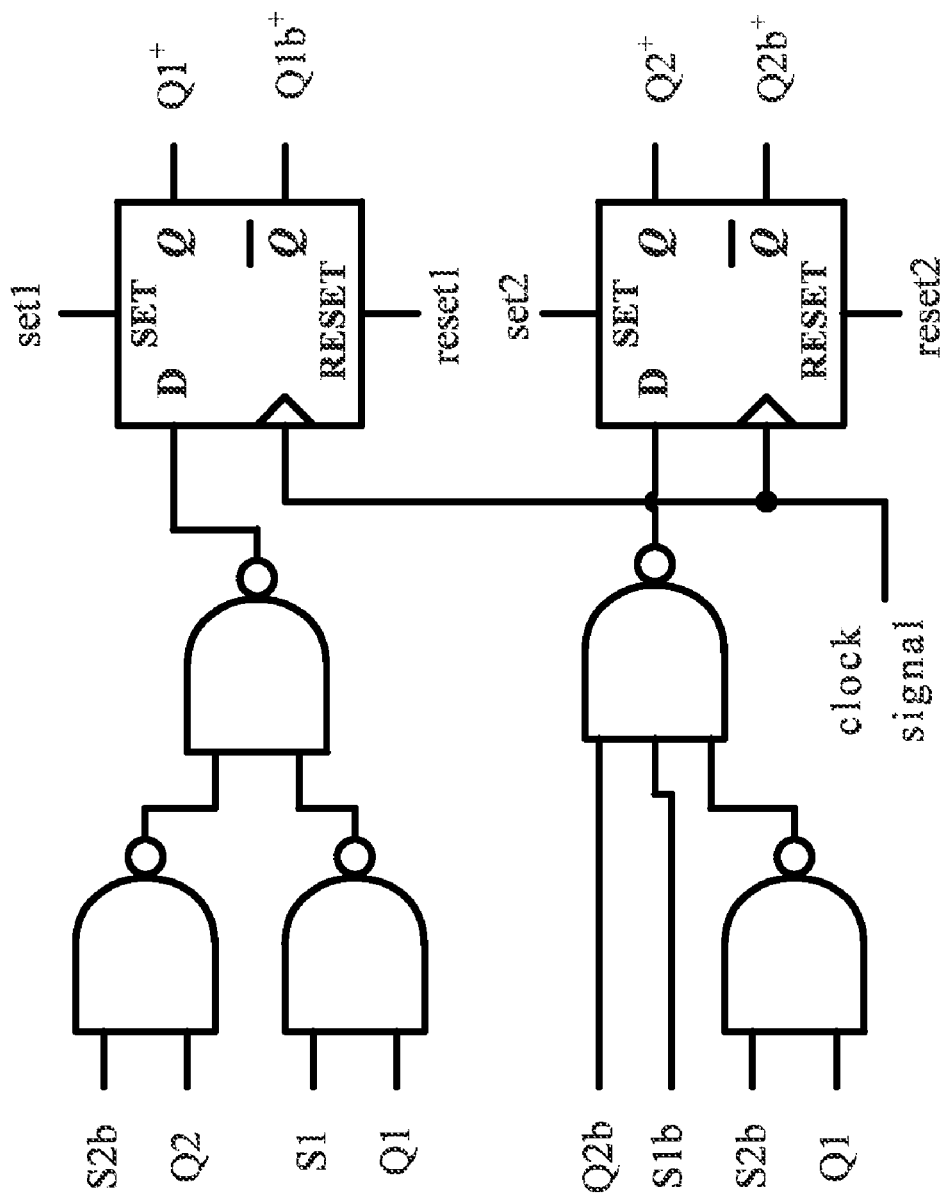
FIG. 5 is a diagram schematically showing the circuit of a digital coefficient control unit according to one embodiment of the present invention.
Figure 6:
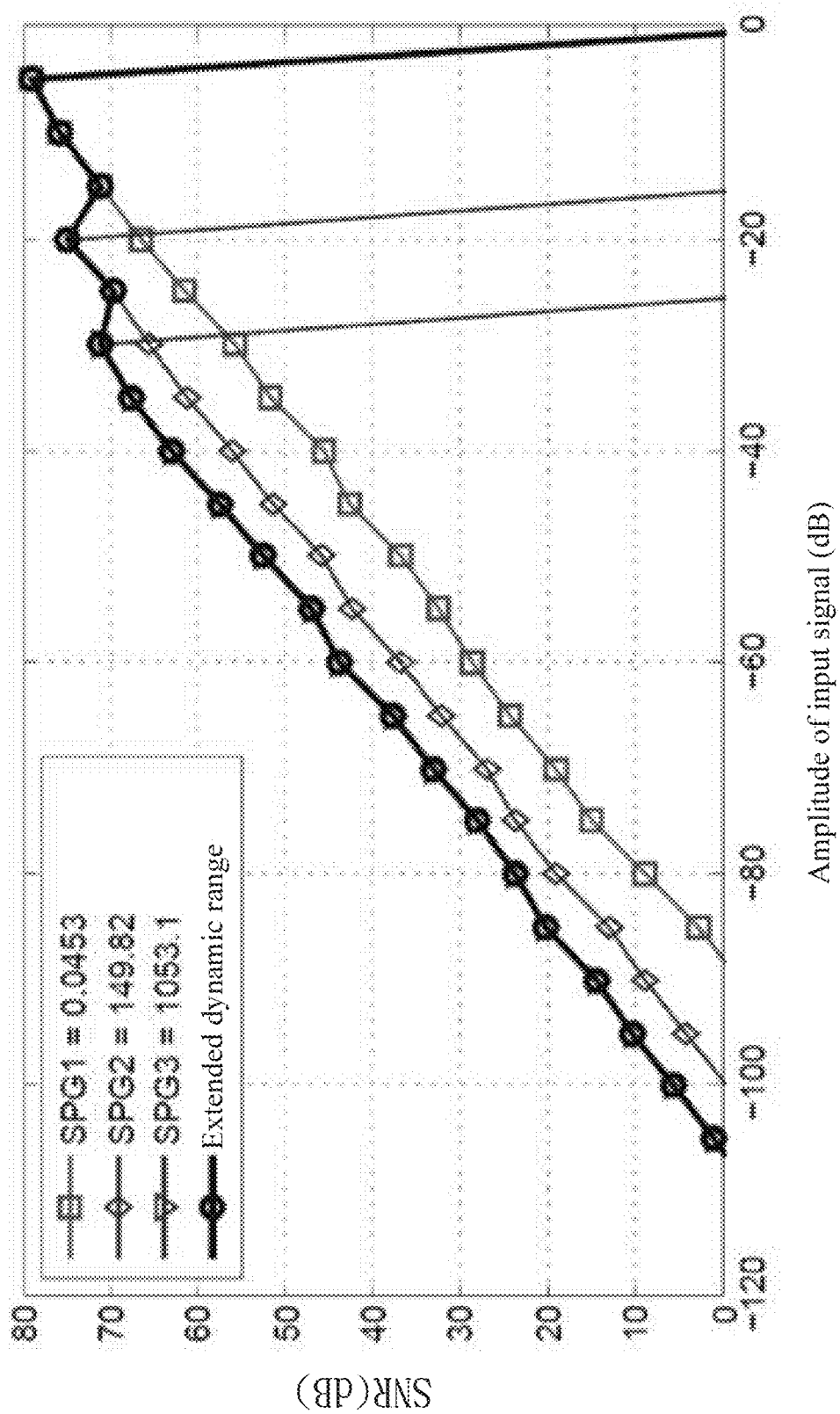
FIG. 6 is a diagram showing the test results of a system simulation according to one embodiment of the present invention.
Figure 7:
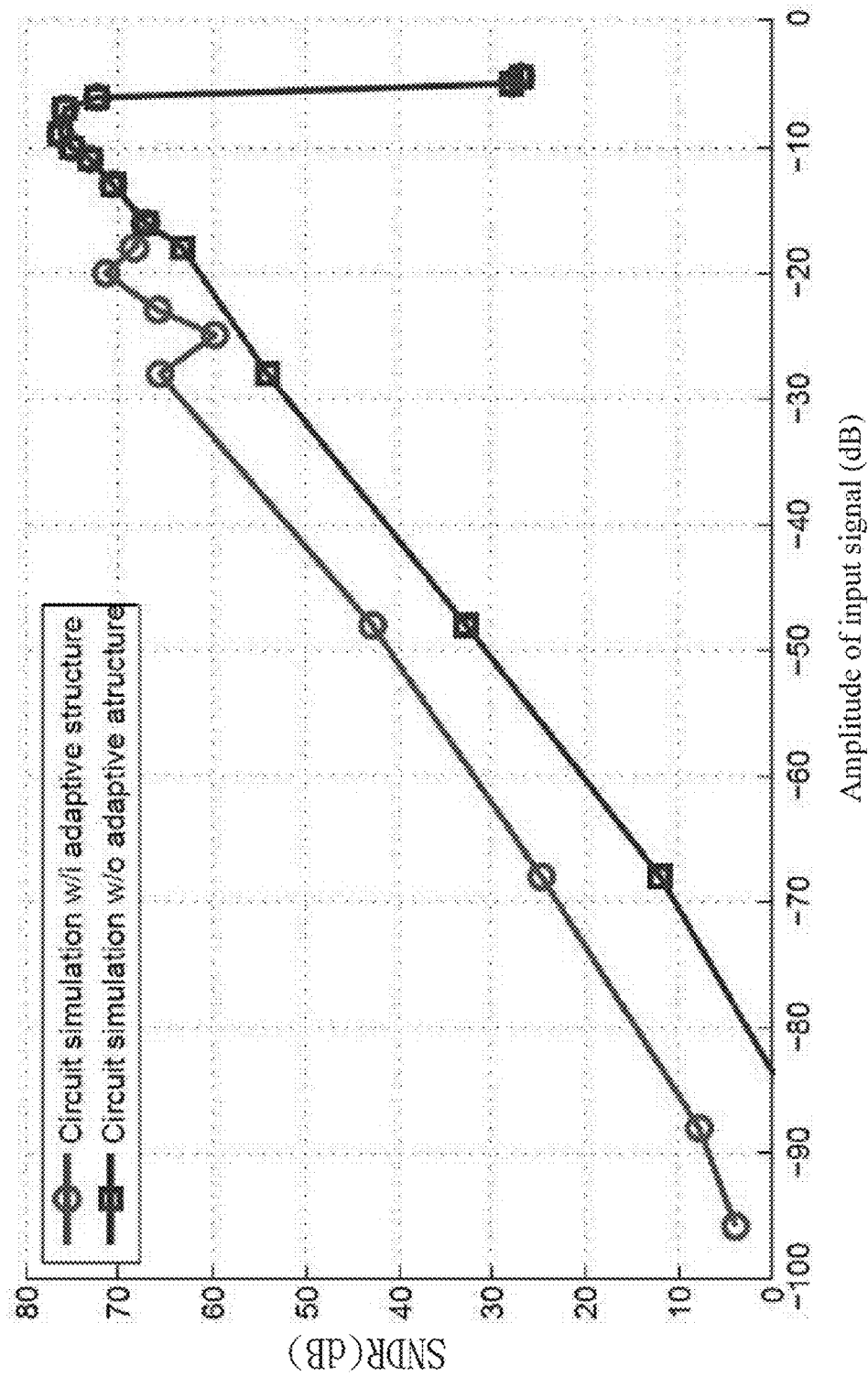
FIG. 7 is a diagram showing the test results of a circuit simulation according to one embodiment of the present invention.

In the sigma-delta modulator architecture capable of automatically improving dynamic range of the present invention, the peak detection unit and the comparator unit can dynamically monitor the outputs of the first stage and the last stage of the sigma-delta modulation unit and trigger the digital coefficient control unit to dynamically switch the feedforward coefficient. According to the output of the digital coefficient control unit, the switch unit dynamically switches among several sets of feedforward coefficients to provide different dynamic ranges for the sigma-delta modulation unit. Refer to FIG. 2 for a preferred embodiment of the present invention, wherein a four-stage CRFB (Cascade of Resonator with Distributed Feedback) sigma-delta modulator is used as the exemplification. In FIG. 2, the components the present invention additionally installs in the system include the peak detection units 1 and 2, the comparators 3 and 4, the digital coefficient control unit 5, and the switch units. During the operation of the system, the peak detection units 1 and 2 detect the outputs of the first-stage integrator and the last-stage integrator. The detected outputs are compared in the comparators 3 and 4. If the detected output is lower than the preset threshold value of the voltage or higher than the preset threshold value of the circuit, the digital coefficient control unit 5 uses a simple logic circuit to trigger the switch, and the switch replaces the original feedforward coefficient with a new feedforward coefficient ($f_i$). Thereby, the feedforward coefficient is automatically changed, and the dynamic range is extended. FIG. 3, FIG. 4, and FIG. 5 are respectively diagrams showing the circuits of the peak detection unit, the comparator and the digital coefficient control unit. Refer to FIG. 6 for the test results of a system simulation of the architecture shown in FIG. 2, wherein the system is a four-stage one; the OSR (Over Sampling Ratio) is 32; the signal bandwidth is 22.5 kHz; and the input signal has a frequency of 5625 Hz. Refer to FIG. 7 for the test results of a circuit simulation of the present invention, wherein the curve connecting the little squares represents the original dynamic range without using the present invention, and the curve connecting the circlets represents the extended dynamic range in the present invention. FIG. 7 proves that the present invention can extend the dynamic range by 16 dB.

The method for automatically improving the dynamic range of a sigma-delta modulator of the present invention installs a dynamic-range-search algorithm in a sigma-delta modulator, which can find out several sets of dynamic-range curves to improve the overall dynamic range according to the SPG variation of the sigma-delta modulator. Next, the method uses a high-level sigma-delta modulator architecture to calculate the feedforward coefficients required by the sigma-delta modulator. Then, the method dynamically monitors the outputs of the first stage and the last stage of the sigma-delta modulation unit and dynamically switches among the feedforward coefficients. The method also stores several sets of the feedforward coefficients for modulation and dynamically provides different dynamic ranges for the sigma-delta modulation unit.

The embodiments described above are only to exemplify the present invention but not to limit the scope of the present invention. Any equivalent modification or variation according to the shapes, structures, characteristics or spirit disclosed in the present invention is to be also included within the scope of the present invention.

What is claimed is:

1. A sigma-delta modulator architecture capable of automatically improving dynamic range, comprising
   a sigma-delta modulation unit performing conversions of digital signals and analog signals with an oversampling and a noise-shaping technique;
   a dynamic-range-search algorithm unit searching for several sets of dynamic-range curves according to a variation of a signal power gain of said sigma-delta modulation unit, improving an overall dynamic range, and calculating feedforward coefficients required by said sigma-delta modulation unit with a high-level sigma-delta modulation architecture unit;
   a peak-detection unit and a comparison unit dynamically monitoring output of each stage of said sigma-delta modulation unit; and
   a digital-coefficient-control unit and a switch unit dynamically switching among said feedforward coefficients and dynamically providing different dynamic ranges for said sigma-delta modulation unit.

2. The sigma-delta modulator architecture according to claim 1, wherein said dynamic-range-search algorithm unit automatically improves a dynamic range of said sigma-delta modulation unit.

3. The sigma-delta modulator architecture according to claim 1, wherein said dynamic-range-search algorithm unit searches for zero points of a signal transfer function, varies said zero points to obtain different signal power gains, collects said zero points to meet requirements, and applies said requirements to said feedforward coefficients obtained in said architecture.

4. The sigma-delta modulator architecture according to claim 1, wherein said dynamic-range-search algorithm unit only varies zero points of said signal transfer function.

5. The sigma-delta modulator architecture according to claim 1, wherein said peak-detection and comparison unit detects outputs of first stage integrator and last stage integrator.

6. The sigma-delta modulator architecture according to claim 1, wherein if said peak-detection and comparison unit detects that said output of each stage of said sigma-delta modulation unit is lower than a threshold value or has been divergent, said peak-detection and comparison unit triggers said digital digital-coefficient-control and switch unit to replace an original feedforward coefficient with a new feedforward coefficient.

7. A method for automatically improving dynamic range of a sigma-delta modulator, comprising steps:
   installing a dynamic-range-search algorithm in a sigma-delta modulator;
   using said dynamic-range-search algorithm to find out several sets of dynamic-range curves to improve an overall dynamic range according to a variation of a signal power gain of said sigma-delta modulator;
   using a high-level sigma-delta modulator architecture to calculate feedforward coefficients required by said sigma-delta modulator;
   dynamically monitoring outputs of first stage and last stage of said sigma-delta modulator and dynamically switching among said feedforward coefficients; and
   storing several sets of said feedforward coefficients for modulation and dynamically providing different dynamic ranges for said sigma-delta modulator.

8. The method for automatically improving dynamic range of a sigma-delta modulator according to claim 7, wherein said dynamic-range-search algorithm automatically improves a dynamic range of said sigma-delta modulation unit.

9. The method for automatically improving dynamic range of a sigma-delta modulator according to claim 7, wherein said dynamically monitoring and said dynamically switching are realized with peak detectors, comparators, a digital coefficient controller and switches.

10. The method for automatically improving dynamic range of a sigma-delta modulator according to claim 9, wherein said peak detectors detect outputs of the first stage integrator and the last stage integrator.

11. The method for automatically improving dynamic range of a sigma-delta modulator according to claim 9, wherein if said comparator detects that said output is lower than a threshold value or has been divergent, said comparator triggers said digital coefficient controller, and said digital coefficient controller trigger said switch to replace an original feedforward coefficient with a new feedforward coefficient.

12. The method for automatically improving dynamic range of a sigma-delta modulator according to claim 7, wherein said storing and said providing are realized with a digital coefficient controller and switches.

13. The method for automatically improving dynamic range of a sigma-delta modulator according to claim 7, wherein said dynamic-range-search algorithm searches for zero points of a signal transfer function, varies said zero points to obtain different signal power gains, collects said zero points to meet requirements, and applies said requirements to said feedforward coefficients obtained in said architecture.

14. The method for automatically improving dynamic range of a sigma-delta modulator according to claim 7, wherein said dynamic-range-search algorithm only varies said zero points of said signal transfer function.

* * * * *